United States Patent [19]

Bert et al.

[11] 4,315,275

[45] Feb. 9, 1982

[54] ACOUSTIC STORAGE DEVICE INTENDED IN PARTICULAR FOR THE CORRELATION OF TWO HIGH-FREQUENCY SIGNALS

[75] Inventors: Alain Bert; Bernard Leclerc; Yves Archambault, all of Paris, France

[73] Assignee: Thomson-CSF, Paris, France

[21] Appl. No.: 51,958

[22] Filed: Jun. 25, 1979

[30] Foreign Application Priority Data

Jun. 29, 1978 [FR] France ............... 78 19504

[51] Int. Cl.³ .............. H01L 29/06; H01L 27/02; H01L 29/92
[52] U.S. Cl. .................................. 357/56; 333/154; 333/150; 357/14; 357/51; 357/55
[58] Field of Search ............... 357/55, 56, 13, 14, 357/50; 333/150

[56] References Cited

U.S. PATENT DOCUMENTS

| 3,065,391 | 11/1962 | Hall ..................... 357/56 |
| 3,244,555 | 4/1966 | Adam et al. ............ 357/56 |
| 3,325,702 | 6/1967 | Cunningham ........... 357/56 |
| 3,754,192 | 8/1973 | Palfreeman ............. 333/150 |
| 3,823,352 | 7/1974 | Pruniaux et al. ........ 357/56 |
| 3,865,646 | 2/1975 | Logan et al. ............ 357/56 |
| 3,878,553 | 4/1975 | Sirles et al. ............. 357/56 |
| 3,896,473 | 7/1975 | Dilorenzo et al. ....... 357/75 |
| 3,916,509 | 11/1975 | Hoeberechts ........... 357/56 |
| 3,975,696 | 8/1976 | Kantorowicz .......... 333/150 |
| 4,075,650 | 2/1978 | Calviello ................ 357/56 |
| 4,097,890 | 6/1978 | Morris et al. ........... 357/567 |

FOREIGN PATENT DOCUMENTS

| 2330144 | 5/1977 | France ................... 357/56 |
| 2335953 | 7/1977 | France ................... 357/56 |

Primary Examiner—Andrew J. James
Attorney, Agent, or Firm—Roland Plottel

[57] ABSTRACT

That face of the non-epitaxied substrate of high resistivity which supports the junction 3 formed by the planar method is treated by a mesa attack in such a way that it is smaller than the opposite face 7. An insulating ring 4 covers the periphery of the junction and projects beyond the substrate. This ring has external dimensions smaller than those of the face 7 beyond which it projects. A metallic layer 6 ensuring an ohmic contact covers in particular the lateral walls of the diode created by the mesa attack except for those zones of these walls beyond which the insulating ring 4 projects. This metallization of the lateral walls acts as an electrode and connects the diodes generally formed on one and the same substrate to one another.

5 Claims, 4 Drawing Figures

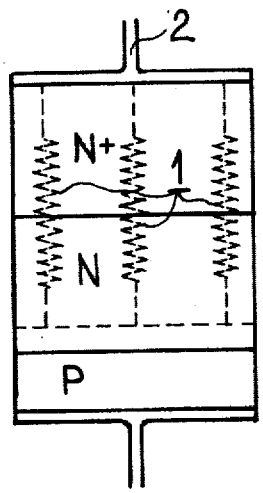
PRIOR ART
FIG_1
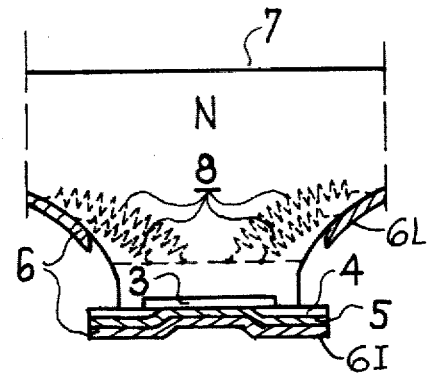
FIG_2
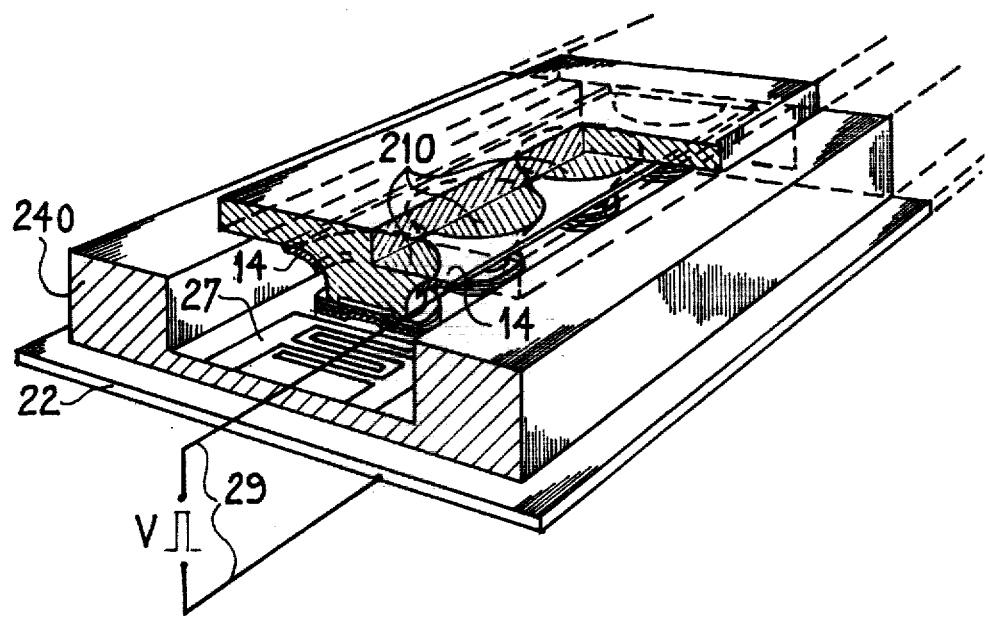
FIG_4

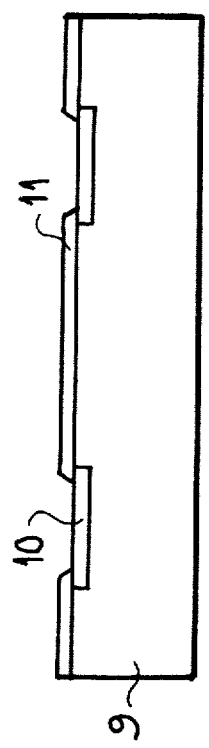
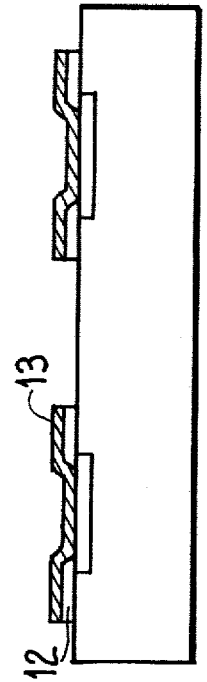
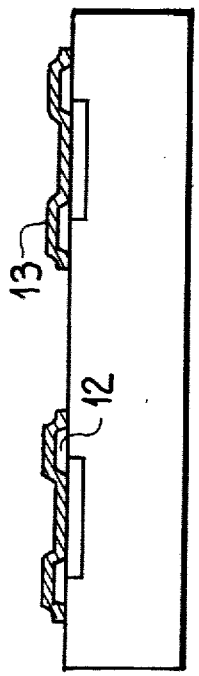
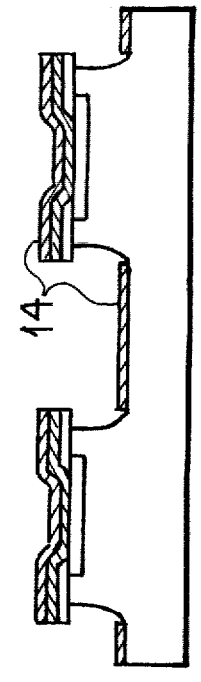
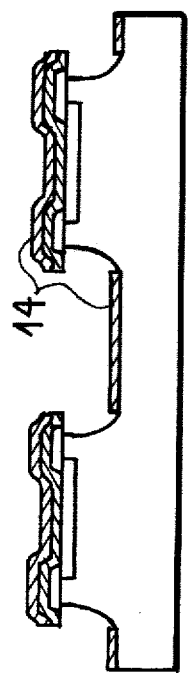

ACOUSTIC STORAGE DEVICE INTENDED IN PARTICULAR FOR THE CORRELATION OF TWO HIGH-FREQUENCY SIGNALS

The present invention relates to an acoustic storage device which is particularly intended for the correlation of two high-frequency signals. The invention also relates to a method for producing the network of diodes used therein.

Acoustic storage devices are known (for example by the Patent Application No. 3.975.696 in the name of THOMSON-CSF) which are formed by a network of cells constituted by diode in series with a capacitor. Each diode comprises an insulated electrode disposed on the surface of a semiconductor substrate generally common to the network, a common electrode being in contact with that surface of the semiconductor substrate which is opposite the surface carrying the insulated electrodes. The dielectric of the capacitors is generally formed by an insulating piezoelectric material whilst their armatures are formed on the one hand by the insulated electrodes of the diodes and on the other hand by a common conductive electrode. Acoustic surface waves are created on the piezoelectric material and collected by two transducers, the diodes being aligned in the direction of propagation of the wave.

Acoustic storage devices may comprise means arranged between the two electrodes common to all the cells and supplying voltage pulses for memorizing a first high-frequency signal and receiving the resultant signal, which is more particularly a correlating signal.

For treating two high-frequency signals, a first high-frequency signal has to be memorized. To this end, this signal is applied to a first transducer which excites an acousto-electric wave on the surface of the piezoelectric material. When this wave is situated below the diodes, a voltage pulse is applied between the two electrodes common to all the cells, biassing the diodes in the forward direction and charging the capacitors with a d.c. component and an a.c. component which constitutes a sampling of the high-frequency signal associated with the position of each cell.

When the second high-frequency signal is subsequently applied to the first transducer, the correlation of the two high-frequency signals is obtained between the two electrodes common to all the cells.

If the second signal is applied to the second transducer, the convolution of the two high-frequency signals is obtained between the two electrodes common to all the cells.

When the second signal applied to the first transducer is brief, the restoration of the first signal is obtained between the two electrodes common to all the cells.

The substrate on which the diodes are formed generally comprises two superposed zones. One of these two zones, which is more heavily doped (N+ in the case of a silicon substrate), is situated on the side of the common electrode whilst the other, which is less heavily doped, is situated on the side of the insulated electrodes so as to reduce the losses of information memorized by the diodes. Accordingly, this second zone advantageously has a low concentration of doping impurities and, hence, a high resistivity amounting to several tens and even to several hundred ohms-centimeter. Now, these values are difficult to obtain reproducibly by epitaxy. In addition, the faults created by epitaxial growth in this case increase the leakage current, thus limiting the memorization time. If the diodes are directly formed on a non-epitaxied substrate of high resistivity, their series resistance greatly reduces the amplitude of the signal applied to them and increases the charging time constant of the capacitors associated with them.

The present invention relates to a new structure for the diodes which are formed on a substrate of high resistivity which is not necessarily epitaxied but which, in spite of this, retains a low series resistance. The present invention also relates to a method for producing a network of diodes such as these.

According to the invention, each diode of the network comprises: a junction formed by the planar method on the central part of a first face of a semiconductor substrate of high resistivity; an insulating ring covering the periphery of the junction and projecting beyond the substrate, this insulating ring having smaller external dimensions than the second face of the substrate, the dimensions of the first face of the substrate being reduced by a mesa attack so that the insulating ring projects beyond the first face; a metallic layer providing for ohmic contact with the central part of the first face, this metallic layer also covering the lateral walls of the diode formed by the mesa attack except for those zones of these walls beyond which the insulating ring projects.

The network of diodes is generally formed on one and the same semiconductor substrate, the metallisation of the lateral walls of the diodes acts as electrode and connects the diodes to one another.

Other objects, features and results of the invention will become apparent from the following description given by way of non-limiting example in conjection with the accompanying drawings, wherein:

FIGS. 1 and 2 are two diagrammatic longitudinal sections symbolically illustrating the internal resistance of a diode of the prior art and of a diode according to the invention respectively.

FIG. 3 diagrammatically illustrates in the form of longitudinal sections the various stages involved in the process for producing a network of diodes according to the invention.

FIG. 4 shows one embodiment of an acoustic storage device using a network of diodes according to the invention.

FIGS. 1 and 2 are two diagrammatic longitudinal sections symbolically illustrating the internal resistance of a diode of the prior art and of a diode according to the invention.

The internal resistance of a diode is equal to the resistance between the zone of the substrate situated outside the space charge zone and the electrode establishing the connection with the diode.

FIG. 1 shows a diode of the prior art of which the internal resistance, globally denoted by the reference 1, has been symbolically illustrated in chain lines. The reference 2 denotes the electrode establishing the connection with the diode which may be for example a P-N junction of which the N+-type substrate comprises an N-type epitaxied zone.

FIG. 2 shows a diode according to the invention in the example where it is formed by a Schottky junction. The invention is equally applicable to an example of embodiment where the diode is formed by a P-N junction.

In every case, the junction 3 is formed by the planar method, the substrate being integral and weakly doped, for example of N-type silicon.

The junction is passivated by an insulating ring 4, for example of silica, which covers its periphery and projects beyond the substrate. The external dimensions of this ring are smaller than those of that face 7 of the substrate which is opposite the face carrying the junction.

A metallic layer 5, for example of platinum, covers the central part of the junction 3, where it establishes the rectifying contact of the Schottky junction, and projects beyond the insulating ring 4.

That face of the substrate which supports the junction is subjected to a mesa attack so that the insulating ring 4 projects beyond this face.

A metallic layer 6 covers both, but separately (a) the layer 5 and (b) the lateral walls of the diode formed by the mesa attack (except for those zones of these walls beyond which the insulating ring 4 projects). The former portion of layer 6 is designated the insulating electrode 6I; and the latter the lateral electrode 6L. Each of the electrodes forms an ohmic contact.

The internal resistance of the diode which is globally denoted by the reference 8 is symbolically shown in the form of chain lines.

The metallisation 6L of the lateral walls of the diode which acts as an electrode enables the thickness of the substrate traversed by the currents through the diode to be reduced. Accordingly, a substrate of high resistivity, of which the advantages in regard to memorization have already been mentioned, may be used without the internal resistance of the diode being excessively increased.

The diodes according to the invention are generally used in the form of a network and are formed on one and the same substrate. The metallisation 6L of the lateral walls of the diodes includes metallisation of the valleys created between the diodes by the mesa attack establishing the connection between the diodes.

FIG. 3 diagrammatically illustrates various stages of a process for producing a network of diodes according to the invention.

A first stage (FIG. 3a) consists in forming junctions 10 on the first face of a substrate 9 of high resistivity, for example of silicon. The junctions are formed by the planar method through an oxide mask 11, for example of silica, which covers the face of the substrate except for the places where junctions have to be formed. Schottky junctions are shown in FIG. 3.

The oxidation layer 11 may be attacked (FIG. $3b_1$) in such a way that only insulating rings 12 covering the peripheries of the junctions and projecting beyond the substrate are left.

A metallic deposit 13 is then applied in one or more layers (for example platinum, titanium, platinum, gold). This deposit forms the rectifying contact of the Schottky junctions. The metal is then removed by chemical etching beyond the insulating rings 12.

The metallic deposit 13 may also be applied (FIG. $3b_2$) before the attack of the oxide layer 11. The metallic layer 13 projects beyond the oxide which is then removed everywhere where it is not protected by the metal so as to form insulating rings 12 covering the peripheries of the junctions and projecting beyond the substrate.

In both cases (FIGS. $3b_1$ and $3b_2$), the external dimensions of the insulating rings 12 have to be smaller than the area of the second face of the substrate reserved for each diode.

The substrate is then subjected to a mesa attack (FIGS. $3c_1$ and $3c_2$). The oxide 12 must be lightly attacked by the source which attacks the substrate. The dimensions of the first face of the substrate are reduced in such a way that the insulating rings 12 project beyond this first face. Metal is then applied by vapour deposition over the entire face of the substrate carrying the junctions. The insulating rings 12 act as a mask during this operation. They make it possible to limit the distribution of the metal establishing an ohmic contact with the metallic layers 13 and hence in particular with those parts of the junctions which are not covered by the insulating rings and with the lateral walls of the diodes formed by the mesa attack, except for those zones of these walls beyond which the insulating rings 12 project. This eliminates the danger of the junctions being short-circuited by this last metallic layer 14.

The depth of the valleys created between the diodes by the mesa attack may be varied. When the network of diodes is placed in a chamber subjected to an electromagnetic field, the metallisation of the valleys enables the radio-frequency losses to be limited whilst the increase in the depth of the valleys in this application enables the parasitic capacitances between the metallic layer 14 and the walls of the chamber to be reduced.

FIG. 4 shows one embodiment of an acoustic storage device using a network of diodes according to the invention.

The reference 210 denotes the network of diodes according to the invention whilst the reference 240 denotes an insulating piezoelectric plate. The reading and writing signals are applied between the connections 29 connected to the metallic layer 14 establishing an ohmic contact and to a common electrode 22 applied to that face of the plate 240 opposite the face carrying the diodes. The reference 27 denotes the input transducer to which the high-frequency wave is applied. The output transducer (not shown) occupies a position symmetrical with that of the input transducer 27 at the other end of the piezoelectric plate 240.

A device of the type described above may be used in an acoustic storage correlator.

What we claim is:

1. Acoustic storage device intended in particular for the correlation of two high-frequency signals, comprising a network of cells, each cell constituted by a diode in series with a capacitor, each diode comprising an insulated electrode disposed on the surface of a semiconductor substrate, the dielectric of the capacitors being formed by an insulated piezoelectric material with their electrodes being formed on the one hand by the insulated electrodes of the diodes, and on the other hand by a conductive electrode which is common to all the cells, acoustic surface waves being created on the piezoelectric material and collected by two transducers and the diodes aligned in the direction of propagation of the waves forming a network which is realized on a semiconductor substrate of high resistivity, amounting to several tens to several hundred ohms-centimeter, each diode comprising:

a planar junction on the semiconductor substrate;
an insulating ring covering the periphery of the junction and projecting beyond the substrate, this insulating ring having external dimensions smaller than the second face of the substrate reserved for each diode, the dimensions of the first face of the substrate being reduced by a mesa attack so that the insulating ring projects beyond the first face;

a metallic layer establishing an ohmic contact with the central part of the first face and forming said insulating electrode;

a metallic layer also covering the lateral walls of the diode formed by the mesa attack except for those zones of these walls beyond which the insulating ring projects and constituting another electrode which is common to all the cells; whereby the metallic layer covering the lateral walls enables the radio-frequency losses to be limited; the increase the depth of valleys between mesas reduces parasitic capacitance; and said high resistivity substrate with the mesa and electrode structure improves the memorization time of the acoustic storage device.

2. A device as claimed in claim 1 wherein the diodes form a network which is produced on one and the same semiconductor substrate and in that the metallisation of the lateral walls of the diodes formed by the mesa attack, except for those zones of these walls beyond which the insulating rings projects, connects the diodes to one another and constitutes the common electrode of the diodes.

3. An apparatus for correlating two high-frequency signals comprising a piezoelectric insulating plate having a first face and an opposite second face, input and output transducers spaced apart from each other on said first face, and a common electrode on said opposite face of said plate;

a semiconductor substrate of high resistivity, amounting to several tens to several hundred ohms-centimeter, having a plurality of mesas with diodes in each mesa, a plurality of electrodes, one at the face of each mesa connected to one terminal of each diode, and in physical contact with said first face of said piezoelectric plate between said transducers; and plurality of electrodes, said piezoelectric substrate and said common electrode defining a plurality of capacitors; a further electrode on said semiconductor substrate, connected to the other terminal of said diodes, and positioned on the same face of the semiconductor substrate as said diodes, but on the lateral wall and in the valleys between the mesas, thereby there being formed a plurality of cells comprising between said further electrode, the diodes having a plurality of electrodes as terminals and a plurality of capacitors between said plurality of electrodes, piezoelectric substrate and the common electrode; said high frequency wave being applied to said input transducer, and reading and writing signals being applied between said common electrode and said further electrode, whereby the common electrode between the mesas enable radio-frequency losses to be limited, and the depth of valleys between mesas reduces paracitic capacitance; and said high resistivity substrate with the mesa and electrode structure improves the memorization time of the acoustic storage device.

4. A correlator according to claim 3, wherein said diodes have their rectifying junction in a portion of the face region of the mesa, an insulating layer extending over a portion of said mesa face covering the rectifying junction at said face and extending beyond the edge of said mesa, and exposing said one terminal of said rectifier, and said plurality of electrodes overlying said insulating layer and making contact with said terminals.

5. A correlator according to claim 4, wherein said rectifying junction is of the planer type, positioned in the central region of said mesa face.

* * * * *